US012575069B1

(12) United States Patent
   Barberi

(10) Patent No.: US 12,575,069 B1
(45) Date of Patent: Mar. 10, 2026

(54) COMPUTER COMPONENT COOLING SYSTEMS

(71) Applicant: AGT-USA, Inc., Corona, CA (US)

(72) Inventor: Steven J. Barberi, Corona, CA (US)

(73) Assignee: AGT-USA, Inc., Corona, CA (US)

( * ) Notice: Subject to any disclaimer, the term of this patent is extended or adjusted under 35 U.S.C. 154(b) by 0 days.

(21) Appl. No.: 19/308,617

(22) Filed: Aug. 25, 2025

Related U.S. Application Data

(60) Provisional application No. 63/766,515, filed on Mar. 4, 2025.

(51) Int. Cl.
   *H05K 7/20* (2006.01)

(52) U.S. Cl.
   CPC ..... *H05K 7/20772* (2013.01); *H05K 7/20272* (2013.01); *H05K 7/20409* (2013.01)

(58) Field of Classification Search
   CPC ........... H05K 7/20772; H05K 7/20272; H05K 7/20409
   USPC ........................................................ 361/699
   See application file for complete search history.

(56) References Cited

U.S. PATENT DOCUMENTS

| | | | | |
|---|---|---|---|---|
| 4,656,559 A * | 4/1987 | Fathi | .................... | H05K 7/1461 |
| | | | | 361/721 |
| 6,349,554 B2 * | 2/2002 | Patel | .................. | H05K 7/20345 |
| | | | | 165/80.4 |
| 2005/0157468 A1 * | 7/2005 | Chen | ......................... | G06F 1/20 |
| | | | | 257/E23.098 |
| 2013/0299232 A1 * | 11/2013 | Fitz-Patrick | ....... | B22D 19/0072 |
| | | | | 174/547 |
| 2016/0095253 A1 * | 3/2016 | Tufty | ....................... | H05K 5/06 |
| | | | | 361/699 |

FOREIGN PATENT DOCUMENTS

| | | | | | |
|---|---|---|---|---|---|
| CN | 114340332 A | * | 4/2022 | ......... | H05K 7/20272 |

* cited by examiner

*Primary Examiner* — Mandeep S Buttar
*Assistant Examiner* — Kyle Oxenknecht
(74) *Attorney, Agent, or Firm* — Crockett & Crockett, PC; K. David Crockett, Esq.

(57) ABSTRACT

Systems for cooling computer systems in housings. The housing are made up of several panels making up the housing and thee panels have coolant channels within the panel walls. A first coolant is disposed within the housing, in direct contact with heat generating computer components. A second coolant is circulated through the channels, removing heat form the first coolant. The second coolant is passed to a heat exchanger, and is cooled by a third coolant (building chilled water, for example).

20 Claims, 6 Drawing Sheets

COMPUTER COMPONENT COOLING SYSTEMS

This application claims priority to U.S. Provisional Application 63/766,515, filed Mar. 4, 2025.

FIELD OF THE INVENTIONS

The inventions described below relate to the computer component cooling systems.

BACKGROUND

Computer systems used for server farms, high-performance servers and AI GPU's require cooling systems to remove heat generated by computer components housed within enclosures, to maintain the temperatures of the components within acceptable ranges. Currently, systems use air cooling, immersion cooling, and direct-to-chip cooling. Coolant is supplied through coolant distribution systems which include pumps and heat exchangers, and rely on a central cooling system (a building HVAC system, for example, cooling facility water). As these computing systems become more powerful, more cooling power is needed. Currently installed computer systems, with increasing heat loads, cannot be effectively cooled with currently installed coolant distribution systems, and would benefit from improved cooling capacity within rack-mounted housings. New systems can also benefit from improved cooling of the enclosures.

SUMMARY

The systems and methods described below provide for enhanced cooling of computer systems, using new coolant flow paths within the walls of the computer enclosures. The system includes a rack-mountable computer system with a housing, comprising several panels making up the housing. The panels have coolant channels within the panel walls. A first coolant is disposed within the housing, in direct contact with heat-generating computer components. A second coolant is circulated through the channels, removing heat from the first coolant. The second coolant is passed to a heat exchanger, and is cooled by a third coolant (building chilled water, for example). This system can be installed in current systems by replacing one or more panels of installed rack-mounted server housings or in new installations.

DETAILED DESCRIPTION OF THE INVENTIONS

Figure 1:
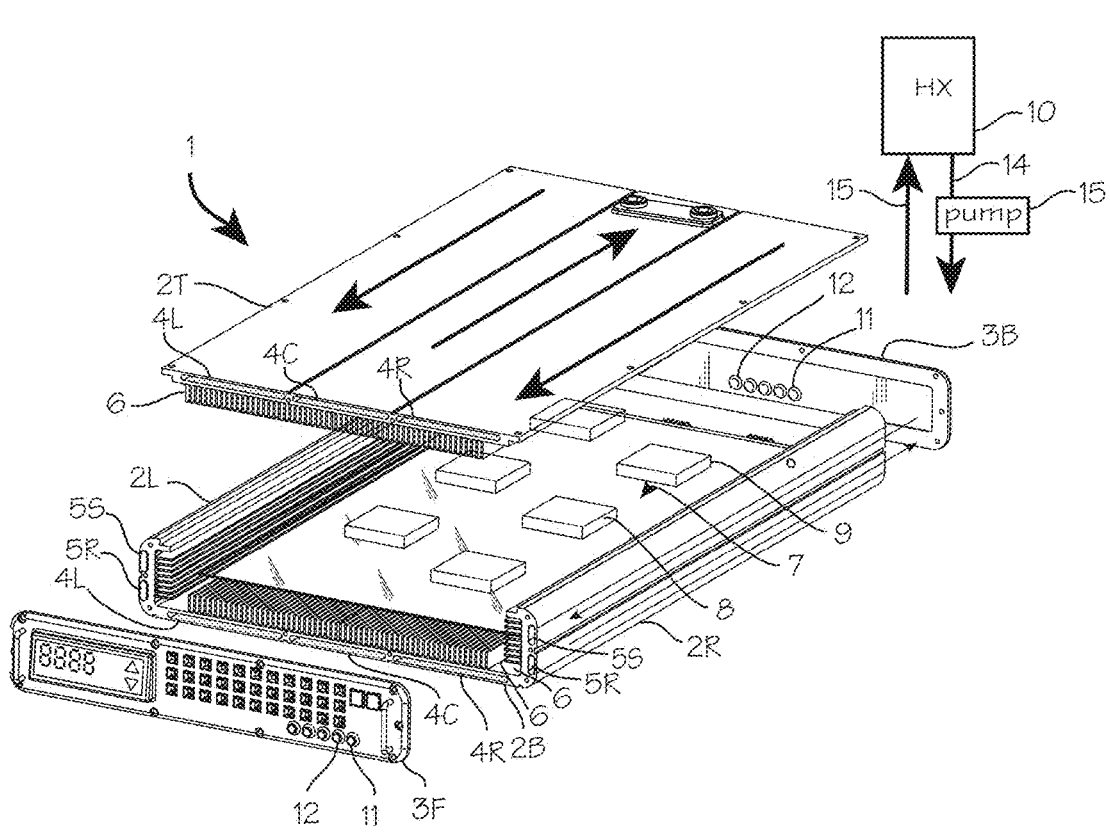
FIG. 1 is a perspective view of a liquid immersion computer cooling system.

FIG. 1 is a perspective view of a liquid immersion computer cooling system. This figure shows a rack-mountable computer system 1 with a housing 2 which includes housing top and bottom panels 2T and 2B, and housing side panels 2R and 2L, and end panels (front and back panels) 3F and 3B. The top and bottom panels of the housing panels are thick enough to include channels 4 (the several channels marked 4L, 4C, 4R) which are configured to accommodate the flow of coolant through the panels. The left and right side panels 2R and 2L of the housing may also be thick enough to include side channels 5 (the several channels marked 5S, 5R) which are configured to accommodate the flow of coolant through the side panels. Cooling fin assemblies 6 are fixed to and in thermal contact with the inner surface of at least one of the panels, and, in this embodiment, cooling fins are fixed to the top panels, the bottom panels or the side panels (all three panels, or any subset of the panels). Cooling pins may be used in place of the cooling fins. The housing is typically a cuboid (rectangular box) in commercial embodiments of rack-mountable computer housing, but may be any shape with corresponding panels of suitable geometry.

This housing provides a housing for a circuit board 7 and several computer components 8. These computer components generate heat and must be cooled to keep the temperature within the housing within the operating limits of the computer components. The circuit board 7 may include a number of computer components that are heat-generating components 9, which may include CPU's, graphics processors, memory or other components.

The housing 2, when assembled, is a sealed enclosure which establishes a sealed space which may be filled (partially or completely) with a primary coolant. The channels 4 and 5 in the top and bottom panels and left and right panels accommodate the flow of a secondary coolant. At least one, and preferably each of the top, bottom, right and left housing panels includes a supply coolant channel (one of 4, 5) and return coolant channel (a different one of 4, 5), for supply and return of a secondary coolant to and from the coolant channels, wherein each channel is disposed between an exterior wall of the panel and an interior wall of the channel, each supply coolant channel communicates at a first end thereof with a coolant supply line and each return coolant channel communicates at a first end thereof with a coolant supply line, and each supply coolant channel at a second end thereof with a return coolant channel at a second end thereof. As illustrated, coolant is supplied to the supply channels through supply port 11, passes forward through the supply channels 5S and returned through the return channels 5R and then through the return port 12 to the heat exchanger 10.

One of the panels (the back panel, front panel, or both) includes connecting ports for establishing fluid communication between the channels in the housing walls and an external heat exchanger/chiller 10. At least one supply port 11 and one return port 12 are provided, with the supply port in fluid communication with some channels, and the return port in fluid communication with other channels (or the opposite end of the same channels), for delivery of the secondary coolant to and from the housing through a supply line 13 and return line 14. A pump 15 is provided, disposed in the system and operable to pump coolant through the channel and the heat exchanger. These components, together with the side channels, establish a cooling loop for flow into and out of the channels. Flow through the channels enters and exits the same end panel, or with a supply port in one end panel and a return port in the other end panel if flow passes only in the first end panel and out the second end panel. Depending on where the heat-generating components are located with the housing, cold incoming secondary coolant may be ported to some channels, flow through the channels, and then returned as warmed secondary coolant through other channels. Any permutation may be used. For example, if the heat-generating components are located toward the sides of the enclosure, cold incoming secondary coolant may be ported through supply port 11 to channels 4L and 4R, and returned through channel 4C and thereafter ported through return port 12 to the external heat exchanger/chiller 10.

Though exemplified with channels in the side walls of the enclosure, an alternative inventive concept can be implemented with tubes close to the inner surface of the top, bottom, left and/or right panels.

Figure 2:
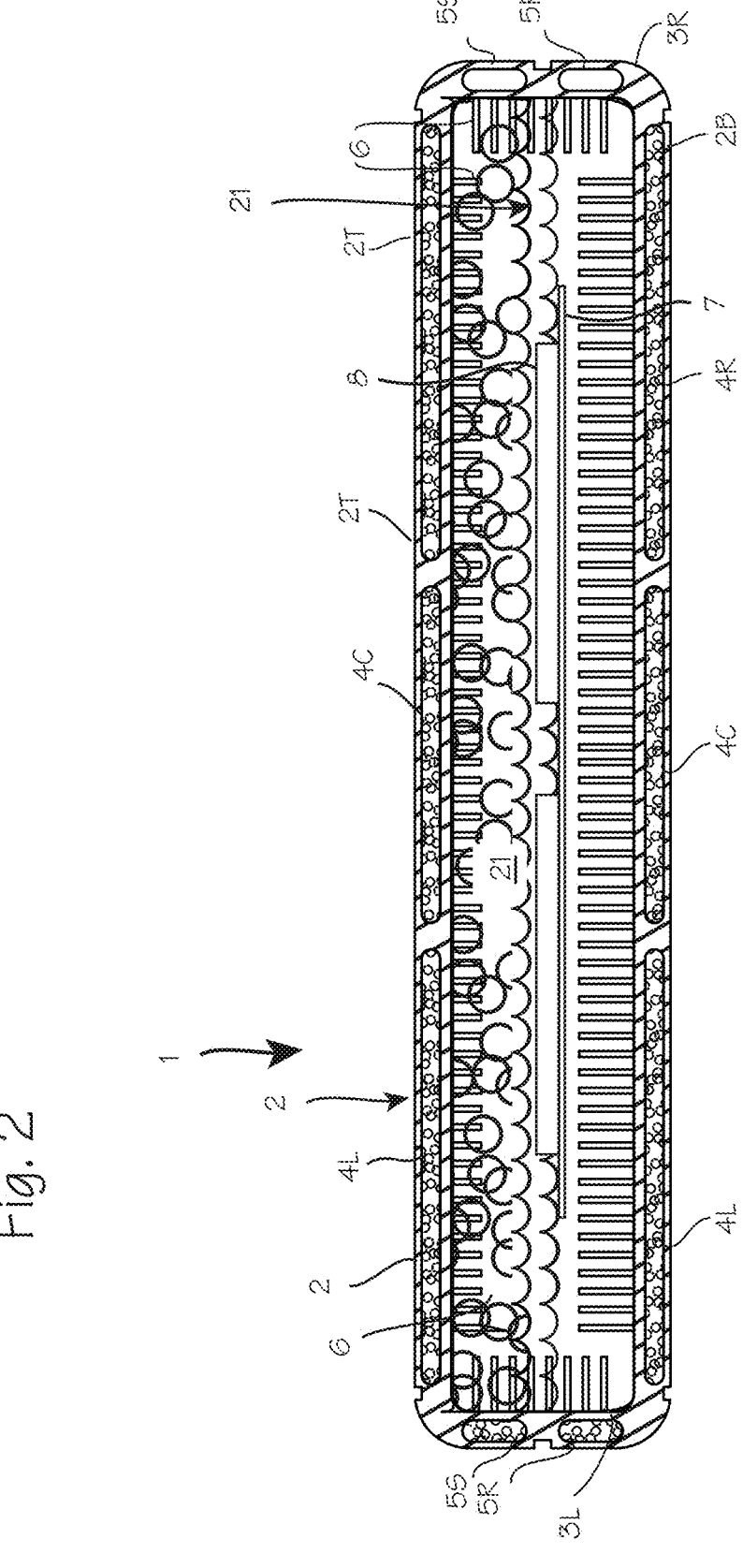
FIGS. 2 and 3 are cross-sections of the liquid immersion computer cooling system of FIG. 1, illustrating two-phase and single phase operation of the system.

FIG. 2 shows a cross-section of the liquid immersion computer cooling system of FIG. 1 when operated as a two-phase cooling system. This figure shows the housing 2 in cross-section, with the circuit board 7 and heat-generating computer components 8 disposed within the housing, along with a primary coolant which covers, or partially covers, the heat-generating components. In operation, the channels 4L, R and C of the top panel 2T, and, optionally, the comparable channels 4L, R and C of the bottom panel 2B are filled with secondary coolant, flowing into some channels through one or more supply ports 11, through those channels, and out of the remaining channels through return ports 12. The flow may be directed through a supply port in the rear panel 3B, forward through one or more channels, and then retrograde through other channels (as in, supply through channels 4L, 4R and return through channel 4C (or vice versa) and out through a return port in the rear panel 3B, or through a supply port in the rear panel 3B forward through channels in the top panel and return through channels in the bottom panels and out through a return port in the rear panel 3B (or vice versa)). Flow may also be provided in a single pass fashion, entering through supply ports in one of the end panels and exiting through a return port in the opposite end panel. The interior space of the housing is partially filled with a reservoir of coolant liquid which boils at temperatures achieved by the heating generating components. This is shown in FIG. 2 as the pool of liquid coolant 21. The coolant liquid is preferably deep enough to cover the heat-generating components. With an appropriately chosen coolant, heat generated by the components will cause the coolant to boil, with gaseous coolant rising within the housing. The resultant gaseous coolant is depicted in FIG. 2 as item 22. Secondary coolant flow in the channels in the top panel 2T cools the cooling fins, which in turn cool the gaseous primary cooling and cause the primary cooling to condense and fall to the bottom of the housing. Continued operation of the system results in a continuous cycle of evaporation of liquid coolant in the bottom of the chamber and condensation of the evaporated coolant at the top of the chamber, with heat being removed from the components by evaporation of the primary coolant and heat being removed from the primary coolant by the cold fins and secondary coolant. Secondary coolant may also be supplied through all the other channels, in the bottom panel and side panel, to cool the liquid phase of the primary coolant. Depending on the heat loads, cooling power of the primary and secondary coolants, the channels in the bottom panel and side channels may be omitted, or not used. This system may be built and operated without fans or pumps to circulate the primary coolant within the enclosure, and may rely on natural circulation of the primary coolant, though fans or pumps may be provided to aid in convective heat transfer from the components to the coolant liquid.

In this two-phase immersion configuration, the primary coolant, which is the coolant that first removes heat from the circuit board and heat-generating components, may be a non-conductive fluid (which need not be dielectric), a dielectric fluid, with a low boiling point (below the expected operating temperature of the enclosure), such as Perfluoro-tri-N-Butylamine (CAS No. 86508-42-1, boiling point 97° C., 207° F.) or Novec 7000 (Heptafluoro-1-Methoxypropane, CAS No. 375-03-1, boiling point 34° C. (93° F.). The secondary coolant, which is the coolant that removes heat from the primary coolant and transfers that heat to an external heat exchanger, and runs through the channels in the housing walls, may be water, glycol, or a mix of water and glycol, or other suitable coolant.

Figure 3:
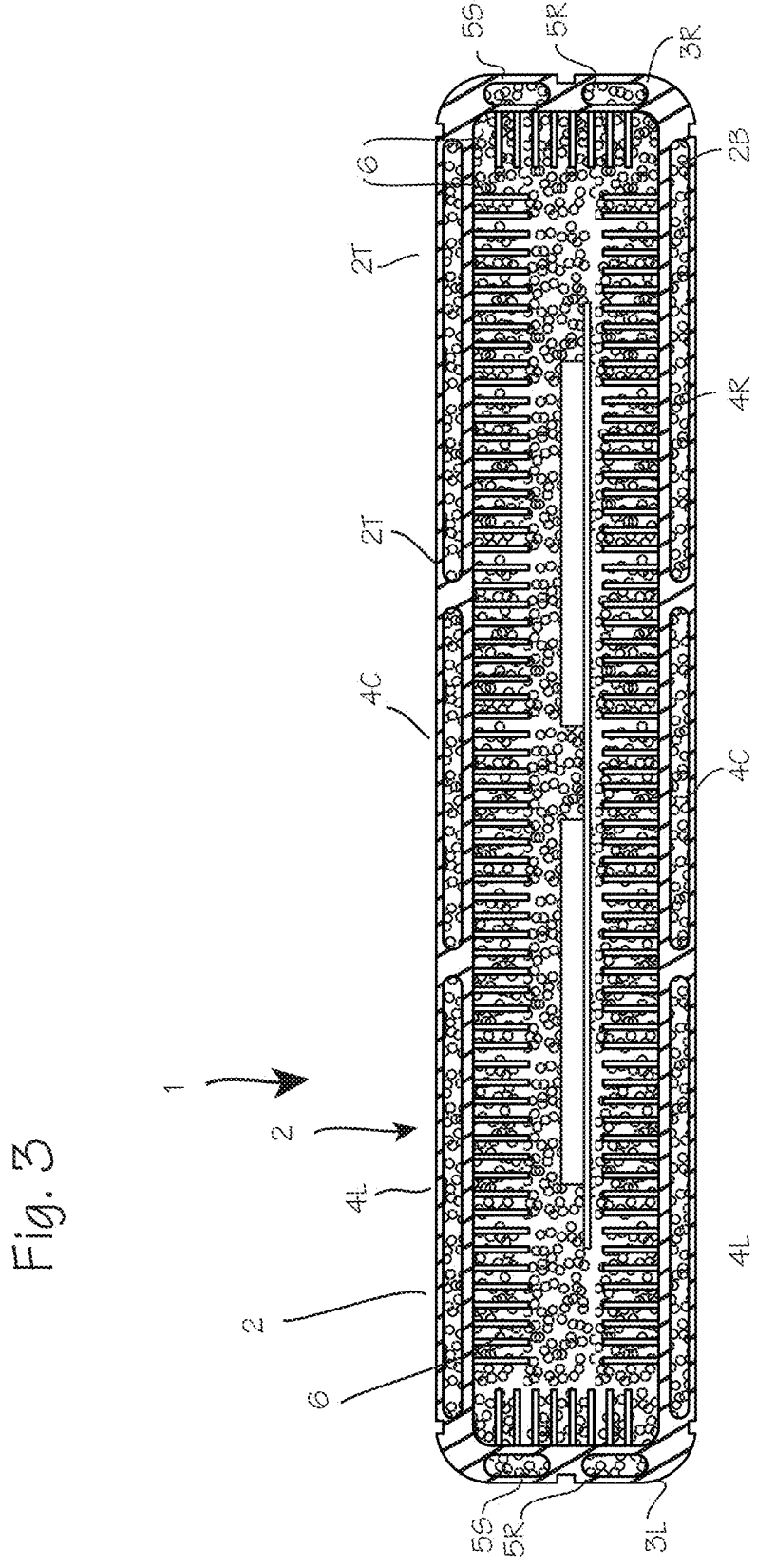

FIG. 3 shows a cross-section of the liquid immersion computer cooling system of FIG. 1 when operated as a single phase cooling system. The housing, panels, channels and ports are the same as those mentioned in the discussion of FIGS. 1 and 2. This figure shows the housing 2 in cross-section, with the circuit board 7 and heat-generating computer components 8 disposed within the housing, along with a primary coolant which fills the enclosure and partially or entirely immerses the heat-generating components (some voids are permissible). The primary coolant is shown in FIG. 3 as item 23. With an appropriately chosen primary coolant (together with an appropriately chosen secondary coolant), heat generated by the components will not cause coolant to boil, though the primary coolant may rise and fall within the housing depending on the cooling provided by the various channels, to provide convective cooling of the heat-generating components.

Secondary coolant flow in the channels in the panels (so many of them that are used for cooling flow) cools the cooling fins, which in turn cool the liquid primary coolant. Continued operation of the system results in a continuous transfer of heat from the heat-generating components to the primary coolant, and heat being removed from the primary coolant by the cold fins and secondary coolant. Secondary coolant may also be supplied through all of the channels, in the top panel, the bottom panel and side panels. Depending on the heat loads, cooling power of the primary and secondary coolants, some channels depicted in the figure may be omitted, or not used. This system may be built and operated without fans or pumps (either within the housing or external to the housing) to circulate the primary coolant within the enclosure, and may rely on natural circulation of the primary coolant within the housing, convection or conduction of heat from the heat-generating components to the primary coolant and thence to the fins, though fans or pumps may be provided to aid in convective heat transfer from the components to the primary coolant liquid.

In this single-phase immersion configuration, the primary coolant, which is the coolant that first removes heat from the circuit board and heat-generating components, may be a non-conductive fluid (which need not be dielectric), a dielectric fluid, such as mineral oil, white oil, silicone oil, synthetic polyalphaolefins, with a boiling point above the expected operating temperature within the enclosure. The primary coolant fills the enclosure sufficiently to cover the heat-generating components. The secondary coolant, which is the coolant that removes heat from the primary coolant and transfers that heat to an external heat exchanger, and runs through the channels in the housing walls, may be water, glycol, or a mix of water and glycol, or other suitable coolant.

Figure 4:
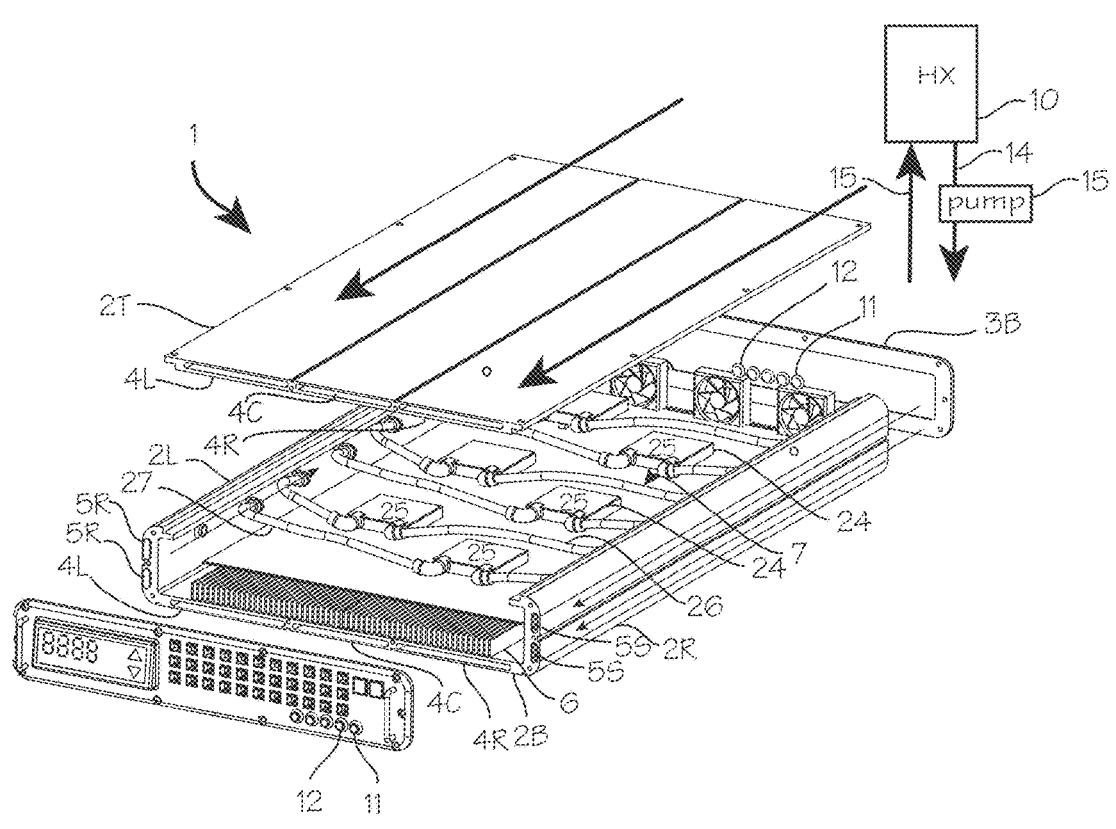
FIGS. 4 and 5 illustrate a cooling system using the housing of FIG. 1, in which coolant flow paths are configured for direct-to-chip cooling.

FIG. 4 is a perspective view of a direct-to-chip computer cooling system. This figure shows a rack-mountable computer system 1 with a housing 2 which includes housing top and bottom panels 2T and 2B, and housing side panels 2R and 2L, and end panels (front and back panels) 3F and 3B. The top and bottom panels of the housing panels are thick enough to include channels 4 which are configured to accommodate the flow of coolant through the panels. The left and right side panels 2R and 2L of the housing may also be thick enough to include channels 5S and 5R which are configured to accommodate the flow of coolant through the panels. Cooling fin assemblies 6 are fixed to and in thermal contact with the inner surface of at least one of the panels, and, in this embodiment, cooling fins are fixed to each of the top and bottom panels and the side panels. Fans 24 are disposed within the housing, for circulating a coolant within the housing. In FIG. 4, the coolant channels 5S in panel 2R are both used for supply of coolant, and coolant channels 5R in panel 2L are both used as return channels, with supply and return ports located in the back end panel 3B. Also, the channels 4L, 4C, 4R within top and bottom panels are, in this illustration, used for single pass coolant flow, with coolant entering in one end, through the ports in the back end panel 3B, and exiting through ports in the front end panel 3F. The assignment of channels to inflow or outflow may be adjusted to accommodate varying heat loads on the circuit board 7.

As with FIG. 1, the housing provides a housing for a circuit board 7 and several computer components 8, at least some of which are heat-generating components 9.

This cooling system is configured for direct-to-chip cooling, and includes cooling jackets or cold plates 25 over at least one of the heat-generating components 9. Direct-to-chip coolant is supplied from an external source, through a port in an end panel, through a channel in a housing panel, through direct-to-chip coolant supply lines 26, and into the jacket(s) 25 and returned through the direct-to-chip coolant return lines 27, then into different channels in the housing panel, out through return ports in an end panel, and then back to the external source (with a heat exchanger and pump interposed). In this figure, channels 5S in one side panel are used to supply coolant to the jacket 25 and channels 5R are used to return coolant from the jacket to the external heat exchanger. In addition, an additional coolant may be disposed within the housing, covering the circuit board and jacket.

The coolant supplied to the jackets through some channels and returned through other channels removes heat from the hottest heat-generating components. The cooling within the remainder of the housing removes heat both from the jackets and also from uncovered heat-generating components. Other channels may be used for additional cooling with external cooling, or not used at all, or not provided. For example, a first coolant can be delivered through side channels to the jackets and back to an external heat exchanger; a second coolant, resident within the housing, can be blown by the fans over the components and returned to fan intakes through the top and bottom center channels, and a third coolant can be supplied and returned through the left and right channels in the top and bottom panels. So, in the embodiment in which all three coolant modes are used, the direct-to-chip coolant constitutes a primary coolant supplied from an external source, the coolant resident in the housing constitutes a secondary coolant, and the coolant in the remaining channels not used for the primary coolant constitutes a tertiary coolant. Note that all of the channels may be used by the primary and tertiary coolant, and the secondary coolant may, instead of returning to the fan intakes through channels in the housing, return to the fan intakes by passing retrograde between one surface 28 of the circuit board and one of the upper and lower panels, after passing prograde over the other surface 29 of the circuit board. Also, secondary coolant can just be turbulently mixed within the housing, with no clearly defined flow path.

Figure 5:
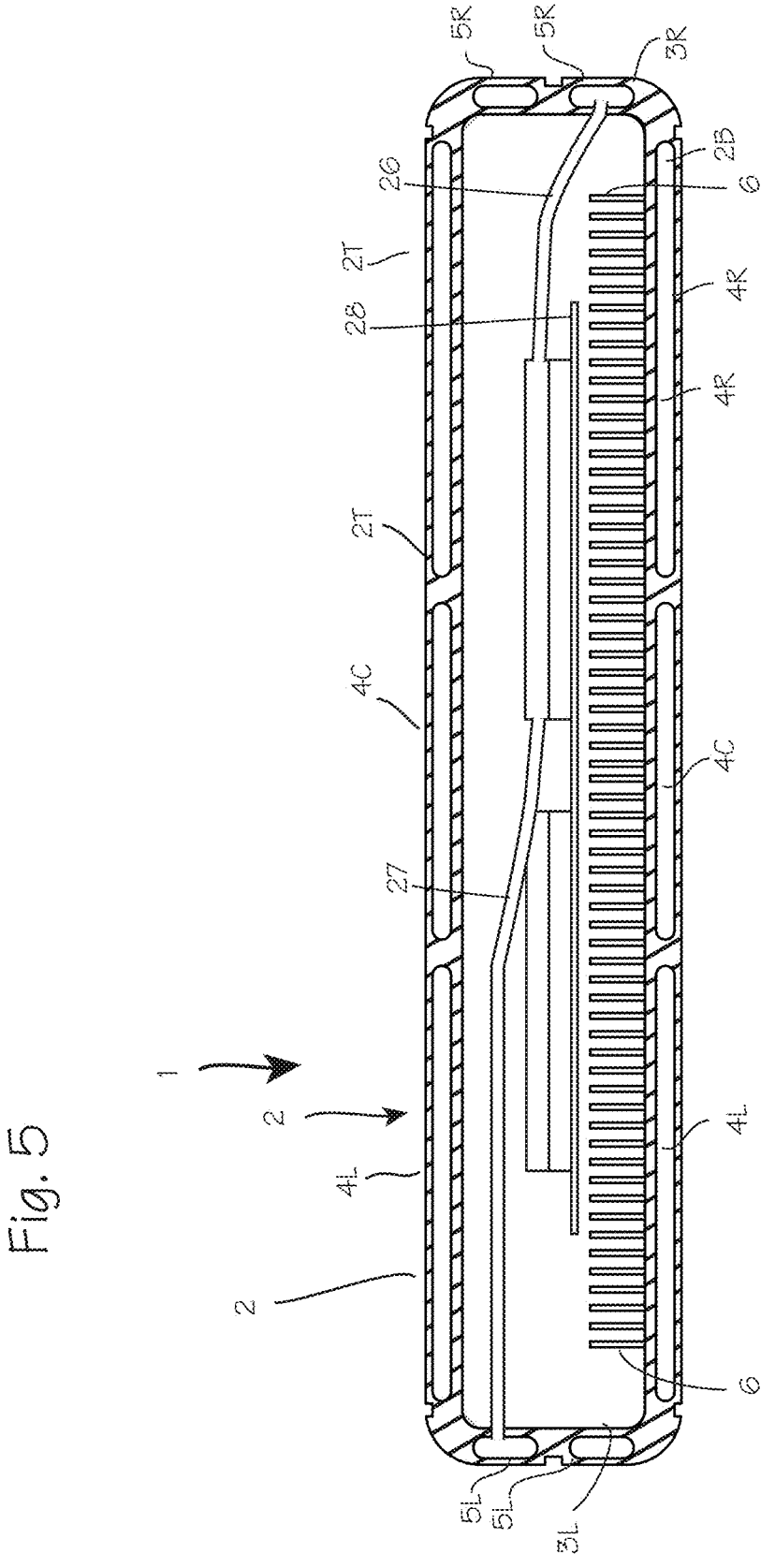

FIG. 5 shows a cross-section of the direct-to-chip cooling computer cooling system of FIG. 4. This figure shows the housing 2 in cross-section, with the circuit board 7 and heat-generating computer components 8 disposed within the housing and covered by the jackets 25. In operation, channels (for example, channels 5L and 5R in the side panels) may be used to supply primary coolant to the jackets and return primary coolant from the jackets to the external source, while the fans cause circulation of the secondary coolant over a surface of the circuit board (for return over the other surface of the circuit board or through channels in the housing), while other channels are used for flow of a tertiary coolant (in which case house coolant used to cool the heat exchanger 10 would be a fourth coolant). FIGS. 4 and 5 depict cooling fins only on the inside of the bottom panel, but cooling fins may be provided on the inside surfaces of other panels.

In this direct-to-chip configuration, the primary coolant, which is the coolant that first removes heat from the circuit board and heat-generating components, may be a non-conductive fluid (which need not be dielectric), a dielectric fluid, such as mineral oil, white oil, silicone oil, synthetic poly alpha olefins, with a boiling point above the expected operating temperature within the jackets. The primary coolant flows through the jackets and covers the heat-generating components.

The secondary coolant may also be a non-conductive fluid (which need not be dielectric, for example propylene glycol, ethylene glycol, calcium chloride solution, potassium formate/acetate), a dielectric fluid, such as mineral oil, white oil, silicone oil, synthetic poly alpha olefins, with a boiling point above the expected operating temperature within the jackets.

Figure 6:
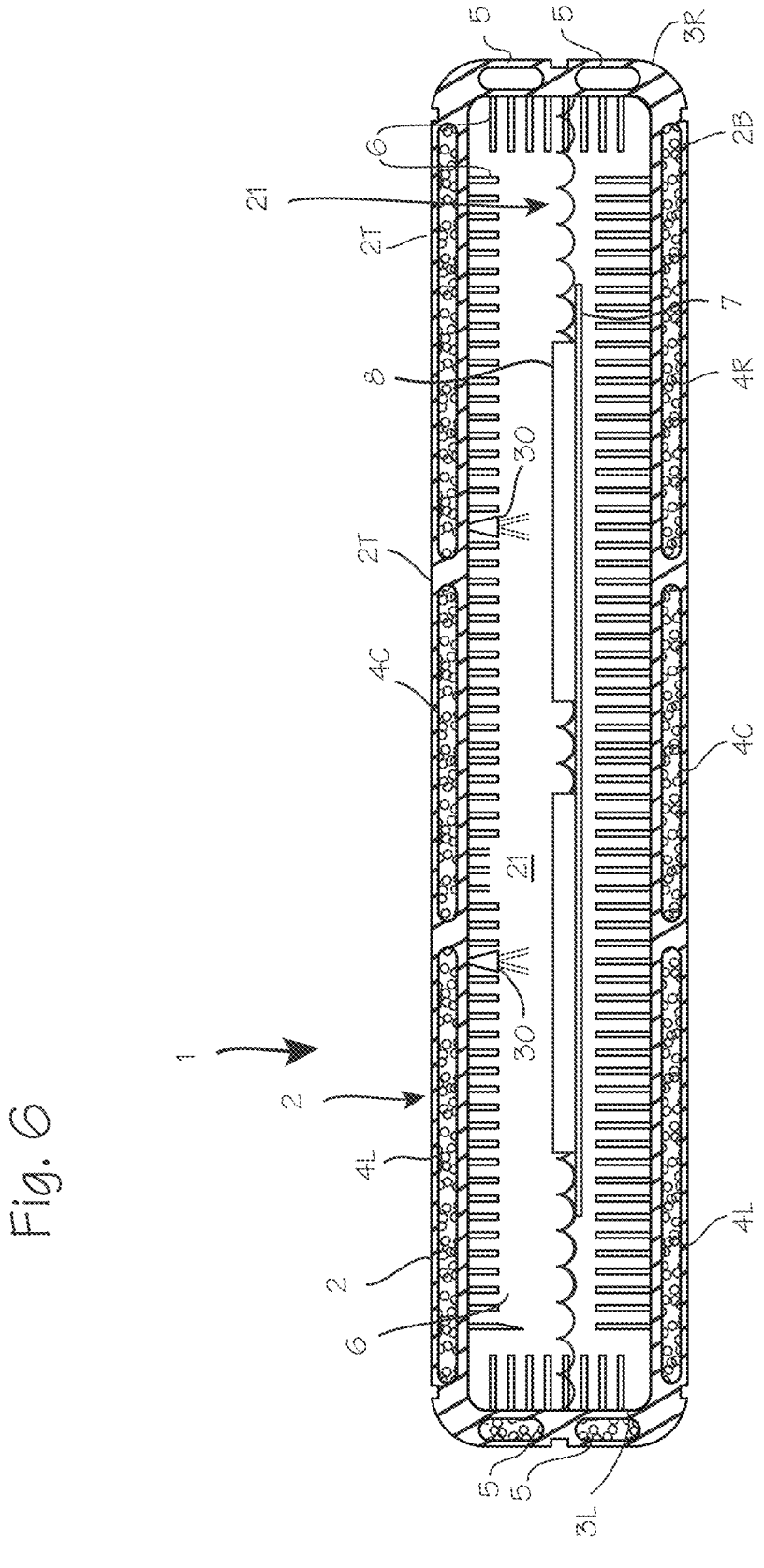
FIG. 6 illustrates a cooling system using the housing of FIG. 2, illustrating use of a spray system for enhanced cooling of components.

FIG. 6 illustrates a cooling system using the housing of FIG. 2, illustrating use of a spray system for enhanced cooling of components. As in FIG. 2, FIG. 6 includes the housing 2 in cross-section, with the circuit board 7 and heat-generating computer components 8 disposed within the housing, along with a primary coolant which covers, or partially covers, the heat-generating components. In operation, the channels 4L, R and C of the top panel 2T, and, optionally, the comparable channels 4L, R and C of the bottom panel 2B are filled with secondary coolant, flowing into some channels through one or more supply ports 11, through those channels, and out of the remaining channels through return ports 12. In addition, this system includes spray heads 30 disposed over or proximate heat-generating components 8. The coolant can be directed specifically toward heat-generating components within the housing through the spray heads disposed proximate the heat-generating components. The spray heads may be supplied with coolant from the pool of coolant 21 in the housing, driven by a pump 31 operable to draw coolant from the reservoir 21 of primary coolant. The pump 31 may be disposed within the housing or outside the housing. As illustrated, the pump feeds the spray heads through a supply line 32 and draws coolant from the coolant pool 21 through suction line 33. The pump may instead be located outside the housing, with the supply line and suction line penetrating the housing, preferably through one of the end panels.

In the description above, the term primary coolant is used to refer to coolant within the housing and the enclosure established by the panels, as it is the coolant that contacts the heat loads. The term secondary coolant is used to refer to coolant flowing through the channels and external heat exchanger. The external heat exchanger may be cooled with a third coolant loop (house cooling) with a tertiary coolant.

Referring to FIGS. 1, 2 and 3, a tertiary coolant, which is the coolant that removes heat from the secondary coolant passing through the heat exchanger 10 and transfers that heat to an external heat exchanger, may be water, glycol, or a mix of water and glycol, or other suitable coolant.

Existing computer component housings may be retrofitted with panels with coolant channels, without replacing all panels of a cuboid enclosure. For example, a panel of a pre-existing enclosure may be removed and replaced with a panel (most conveniently, top panel 2T with channels such as channels 4) in any of the figures, and these channels can be used, along with the heat exchanger 10, to remove heat from any coolant in an existing single-phase or two-phase cooling system that includes solid (without channels) panels in the remainder of the housing.

In use, the system can be implanted by providing the enclosure according to any one of the figures (with one or more panels having the coolant channels), with a circuit board and computer components inside the housing, filling the enclosure with a primary coolant liquid, partially (for two phase immersion cooling) or completely (for single phase immersion cooling), or a primary coolant gas (air, for example), and connecting the coolant channels within the panels to a source of a secondary coolant, and circulating the secondary coolant through the channels and a heat exchanger. The method may also include, as mentioned above, operating a pump or fan within or without the enclosure to circulate or mix the primary coolant within the enclosure. In this method, heat drawn from the heat-generating components into the primary coolant will be transferred to the secondary coolant in the channels, and heat in the secondary channels will be transferred to a third coolant by the external heat exchanger.

While the preferred embodiments of the devices and methods have been described in reference to the environment in which they were developed, they are merely illustrative of the principles of the inventions. The elements of the various embodiments may be incorporated into each of the other species to obtain the benefits of those elements in combination with such other species, and the various beneficial features may be employed in embodiments alone or in combination with each other. Other embodiments and configurations may be devised without departing from the spirit of the inventions and the scope of the appended claims.

I claim:

1. A computer component cooling system comprising: a housing (2) for housing computer components, said housing comprising housing panels including a top panel (2T), bottom panel (2B), first side panel (2R) and second side panel (2L), a front end panel (3F) and a back end panel (3B), wherein each of the housing panels includes a coolant channel (any one of 4L, 4R, 4C, 5S, or 5R) disposed between an exterior wall of the panel and an interior wall of the channel; a reservoir (21) of a primary coolant disposed within the housing, further comprising: a heat exchanger (10) in fluid communication with the coolant channels, through a supply line (13) and return line (14), establishing a coolant loop (4 or 5, 13, 14) for flow of a secondary coolant through the coolant channels (4, 5); a pump (15) operable to pump coolant through the coolant loop (4, 5, 13, 14) and heat exchanger.

2. The system of claim 1, further comprising: cooling fins or pins 6 disposed on an interior surface of at least one of the panels.

3. The system of claim 1, wherein:
the reservoir 21 of a primary coolant substantially fills the housing.

4. The system of claim 1, wherein:
the reservoir 21 of a primary coolant is a liquid, and the liquid substantially fills the housing.

5. The system of claim 1, wherein:
the reservoir 21 of a primary coolant is a gas and the system further comprises a pump or fan 24 within the housing operable to circulate the primary coolant within the housing.

6. The system of claim 1, wherein:
the reservoir 21 of a primary coolant within the housing comprises both a liquid phase of a first coolant and a gaseous phase of said first coolant.

7. The system of claim 1 wherein the housing is devoid of a pump or fan within the housing operable to circulate the primary coolant within the housing.

8. The system of claim 1 wherein the system is devoid of a pump or fan operable to circulate the primary coolant within the housing.

9. The system of claim 1, further comprising:
a cooling jacket for at least one component
a coolant supply line communicating from a first channel to the cooling jacket, for supply of secondary coolant to the jacket;
a coolant return line communicating from the cooling jacket to a second channel, for removal of secondary coolant from the jacket.

10. A computer component cooling system comprising:
a housing (2) for housing computer components, said housing comprising housing panels including a top panel (2T), bottom panel (2B), first side panel (2R) and second side panel (2L), a front end panel (3F) and a back end panel (3B), wherein each housing panel includes a supply coolant channel and a return coolant channel, for supply and return of a secondary coolant to and from the coolant channels, wherein each channel is disposed between an exterior wall of the panel and an interior wall of the channel, each supply coolant channel communicates at a first end thereof with a coolant supply line and each return coolant channel communicates at a first end thereof with a coolant return line, and each supply coolant channel at a second end thereof communicates with a return coolant channel at a second end thereof;
a reservoir 21 of a primary coolant disposed within the housing.

11. The system of claim 10, further comprising:
a heat exchanger 10 in fluid communication with the coolant channels, through a supply line 13 and return line 14, establishing a coolant loop (4 or 5, 13, 14) for flow of a secondary coolant through the coolant channels (4, 5);
a pump 15 operable to pump coolant through the coolant loop (4, 5, 13, 14) and heat exchanger.

12. The system of claim 10, further comprising:
cooling fins or pins 6 disposed on an interior surface of at least one of the panels.

13. The system of claim 10, wherein:
the reservoir 21 of a primary coolant substantially fills the housing.

14. The system of claim 10, wherein:
the reservoir 21 of a primary coolant is a liquid, and the liquid substantially fills the housing.

15. The system of claim 10, wherein:

the reservoir 21 of a primary coolant is a gas and the system further comprises a pump or fan 24 within the housing operable to circulate the primary coolant within the housing.

16. The system of claim 10, wherein:

the reservoir 21 of a primary coolant within the housing comprises both liquid phase of a first coolant and a gaseous phase of said first coolant.

17. The system of claim 10 wherein the housing is devoid of a pump or fan within the housing operable to circulate the primary coolant within the housing.

18. The system of claim 10 wherein the system is devoid of a pump or fan operable to circulate the primary coolant within the housing.

19. The system of claim 10, further comprising:

a cooling jacket for at least one heat-generating component a coolant supply line communicating from a first channel to the cooling jacket, for supply of secondary coolant to the jacket;

a coolant return line communicating from the cooling jacket to a second channel, for removal of secondary coolant from the jacket.

20. The system of claim 1, further comprising:

a spray head 30 disposed within the housing, positioned within the housing to spray the primary coolant onto heat-generating computer components housed within the housing, wherein said spray head is fed by a spray pump 31 drawing coolant from the reservoir 21 of a primary coolant.

\* \* \* \* \*